(12) United States Patent
Baek

(10) Patent No.: US 9,196,834 B2
(45) Date of Patent: Nov. 24, 2015

(54) METHOD OF MANUFACTURING AN ORGANIC LIGHT EMITTING STRUCTURE AND METHOD OF MANUFACTURING AN ORGANIC LIGHT EMITTING DISPLAY DEVICE

(71) Applicant: Samsung Display Co., Ltd., Yongin, Gyeonggi-Do (KR)

(72) Inventor: Seog-Soon Baek, Suwon-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/302,574

(22) Filed: Jun. 12, 2014

(65) Prior Publication Data

US 2014/0370635 A1    Dec. 18, 2014

(30) Foreign Application Priority Data

Jun. 14, 2013  (KR) .................. 10-2013-0068135

(51) Int. Cl.
| | |
|---|---|
| *H01L 51/40* | (2006.01) |
| *H01L 51/00* | (2006.01) |
| *H01L 21/285* | (2006.01) |
| *H01L 51/52* | (2006.01) |

(52) U.S. Cl.
CPC ...... *H01L 51/0019* (2013.01); *H01L 21/28556* (2013.01); *H01L 51/5287* (2013.01); *H01L 51/5296* (2013.01)

(58) Field of Classification Search
CPC ............. H01L 21/0228; H01L 21/28194; H01L 21/28556; H01L 21/3105; H01L 21/28079; H01L 21/048; H01L 27/098; H01L 27/1104; H01L 29/435; H01L 51/5296; H01L 51/5287

USPC ......... 438/99, 82, 85, 91, 104, 141, 308, 463, 438/571, 572, 573, 575, 582, 583, 692, 513, 438/535; 257/E21.006, E21.046, E21.062, 257/E21.094, E21.126, E21.127, E21.17, 257/E21.22, E21.267, E21.304, E21.435, 257/E21.411, E21.421

See application file for complete search history.

(56) References Cited

U.S. PATENT DOCUMENTS

| | | | | |
|---|---|---|---|---|
| 6,661,029 | B1 * | 12/2003 | Duggal ........................ | 257/89 |
| 7,787,169 | B2 * | 8/2010 | Abramson et al. ........... | 359/267 |
| 8,517,787 | B2 * | 8/2013 | Kim .............................. | 445/24 |
| 8,975,808 | B2 * | 3/2015 | Cho .............................. | 313/116 |
| 2009/0272969 | A1 | 11/2009 | Suh et al. | |

FOREIGN PATENT DOCUMENTS

| | | |
|---|---|---|
| JP | 06-067016 A | 3/1994 |
| JP | 2012-104302 A | 5/2012 |
| KR | 1020060102697 A | 9/2006 |

* cited by examiner

*Primary Examiner* — David Nhu
(74) *Attorney, Agent, or Firm* — Cantor Colburn LLP

(57) ABSTRACT

A method of manufacturing an organic light emitting structure is provided as follows. A first electrode is formed on a lower substrate. A pixel defining layer is formed adjacent to the first electrode on the lower substrate. A preliminary charge transport layer is formed on the first electrode and the pixel defining layer. An organic light emitting layer is formed on the preliminary charge transport layer. The preliminary charge transport layer is selectively etched to form a charge transport layer. A second electrode is formed on the organic light emitting layer.

20 Claims, 6 Drawing Sheets

130   120   110   100

130 140b 140a 120 110   100

METHOD OF MANUFACTURING AN ORGANIC LIGHT EMITTING STRUCTURE AND METHOD OF MANUFACTURING AN ORGANIC LIGHT EMITTING DISPLAY DEVICE

This application claims priority to Korean patent Application No. 10-2013-0068135, filed on Jun. 14, 2013, and all the benefits accruing therefrom under 35 U.S.C. §119, the disclosure of which is hereby incorporated by reference herein in its entirety.

BACKGROUND

1. Field

Exemplary embodiments relate generally to a method of manufacturing an organic light emitting display structure, and a method of manufacturing an organic light emitting display device. More particularly, exemplary embodiments relate to a method of manufacturing an organic light emitting display structure having improved luminescence characteristics, and a method of manufacturing the organic light emitting display device.

2. Description of the Related Art

An organic light emitting display device displays desired information such as images, letters and/or characters using light that is generated by combining holes provided from an anode with electrons provided from a cathode in an organic layer thereof. The organic light emitting display device may ensure relatively wide viewing angle, rapid response speed, small thickness, low power consumption, etc. Accordingly, the organic light emitting display device is being explored as a next-generation display device.

In the organic light emitting display device, a charge transport layer such as a hole injection layer ("HIL"), a hole transfer layer ("HTL"), an electron injection layer ("EIL") and/or an electron transfer layer ("ETL") may be generally disposed to promote charge carrier (e.g., hole or electron) movement.

SUMMARY

One or more exemplary embodiment provides a method of manufacturing an organic light emitting structure having improved luminescence characteristics.

One or more exemplary embodiment provides a method of manufacturing an organic light emitting display device having the organic light emitting structure.

According to an exemplary embodiment, a method of manufacturing an organic light emitting structure is provided as follows. A first electrode is formed on a lower substrate. A pixel defining layer is formed adjacent to the first electrode on the lower substrate. A preliminary charge transport layer is formed on the first electrode and the pixel defining layer. An organic light emitting layer is formed on the preliminary charge transport layer. The preliminary charge transport layer is selectively etched to form a charge transport layer. A second electrode is formed on the organic light emitting layer.

In an exemplary embodiment, the method is further provided as follows. A lead spaced apart from the first electrode is disposed on the lower substrate. The second electrode may be extended to be electrically connected to the lead.

In an exemplary embodiment, the preliminary charge transport layer may be formed by at least one of a slit coating process, a bar coating process, and a spin coating process, and the preliminary charge transport layer may cover the entire first electrode and the entire pixel defining layer.

In an exemplary embodiment, the preliminary charge transport layer may be partially etched by an etching solution including at least one of water, acetone and anisole.

In an exemplary embodiment, the etching solution may be selectively applied on the preliminary charge transport layer by at least one of an offset printing process, a gravure offset printing process, a gravure reverse offset printing process, a printing process, an inkjet printing process, and a nozzle printing process.

In an exemplary embodiment, the method may further include applying an inert gas on the lower substrate to remove the etching solution remaining on the lower substrate, after the preliminary charge transport layer is partially etched by the etching solution.

In an exemplary embodiment, the lower substrate may include a pixel region, and a peripheral region surrounding the pixel regions, and the first electrode may be formed in the pixel region and the lead is formed in the peripheral region.

In an exemplary embodiment, the charge transport layer may include a hole transport layer or a hole injection layer.

In an exemplary embodiment, the charge transport layer may include an electron transport layer or an electrode injection layer.

According to another exemplary embodiment, a method of manufacturing an organic light emitting display device is provided as follows. A lower structure including a switching element and an insulating layer is formed on a lower substrate. A first electrode is formed on the lower structure. The first electrode is electrically connected to the switching element. A pixel defining layer is formed adjacent to the first electrode on the lower structure. A preliminary charge transport layer is formed on the first electrode and the pixel defining layer. An organic light emitting layer is formed on the preliminary charge transport layer. The preliminary charge transport layer is selectively etched to form a charge transport layer. A second electrode is formed on the organic light emitting layer.

In an exemplary embodiment, the method is further provided as follows. A lead being spaced apart from the first electrode is disposed on the lower substrate. The second electrode may be extended to be electrically connected to the lead.

In an exemplary embodiment, the preliminary charge transport layer may be formed by at least one of a slit coating process, a bar coating process, and a spin coating process, and the preliminary charge transport layer may cover the entire first electrode and the entire pixel defining layer.

In an exemplary embodiment, the preliminary charge transport layer may be partially etched by an etching solution including at least one of water, acetone and anisole.

In an exemplary embodiment, the charge transport layer may partially cover the pixel defining layer.

In an exemplary embodiment, the etching solution may be selectively applied on the preliminary charge transport layer by at least one of an offset printing process, a gravure offset printing process, a gravure reverse offset printing process, a printing process, an inkjet printing process, and a nozzle printing process.

In an exemplary embodiment, the method may further include applying an inert gas on the lower substrate to remove the etching solution remaining on the lower substrate, after the preliminary charge transport layer is partially etched by the etching solution.

In an exemplary embodiment, the lower substrate may include a pixel region, and a peripheral region surrounding the pixel region, and the first electrode may be formed in the pixel region and the lead may be formed in the peripheral region.

In an exemplary embodiment, the charge transport layer may include a hole transport layer or a hole injection layer.

In an exemplary embodiment, the charge transport layer may include an electron transport layer or an electrode injection layer.

In an exemplary embodiment, the switching element may include a thin film transistor or an oxide semiconductor device.

According to one or more exemplary embodiment, the charge transport layer may be formed by selectively etching the preliminary charge transport layer before the second electrode is formed, and then the second electrode and the lower substrate may be connected to each other in forming the second electrode. Accordingly, electrical contact efficiency between the second electrode and the lower substrate is improved. That is, the organic light emitting display structure may have improved luminescence characteristics.

According to one or more exemplary embodiment, the charge transport layer may be formed by selectively etching the preliminary charge transport layer before the second electrode is formed, and then the lower substrate may be encapsulated in forming the second electrode. Accordingly, encapsulating efficiency may be improved. That is, the organic light emitting display device may have an extended life time.

BRIEF DESCRIPTION OF THE DRAWINGS

Illustrative, non-limiting exemplary embodiments will be more clearly understood from the following detailed description taken in conjunction with the accompanying drawings.

DETAILED DESCRIPTION

Figure 1:
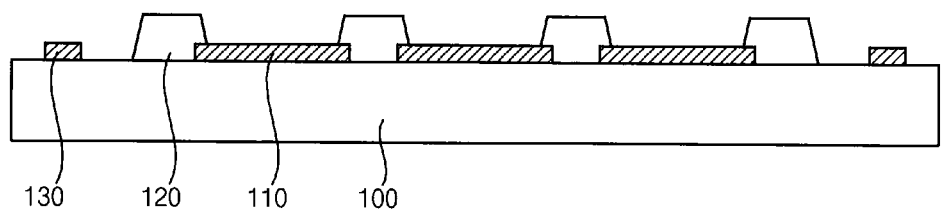
FIGS. 1 through 5 are diagrams illustrating an exemplary embodiment of a method of manufacturing an organic light emitting structure in accordance with the invention.

Various exemplary embodiments will be described more fully hereinafter with reference to the accompanying drawings, in which some exemplary embodiments are shown. The invention may, however, be embodied in many different forms and should not be construed as limited to the exemplary embodiments set forth herein. Rather, these exemplary embodiments are provided so that this disclosure will be thorough and complete, and will fully convey the scope of the invention to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms.

These terms are used to distinguish one element from another. Thus, a first element discussed below could be termed a second element without departing from the teachings of the invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular exemplary embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

In an organic light emitting display device, a charge transport layer such as a hole injection layer ("HIL"), a hole transfer layer ("HTL"), an electron injection layer ("EIL") and/or an electron transfer layer ("ETL") may be generally disposed to promote charge carrier (e.g., hole or electron) movement.

When the charge transport layer is coated on a lower substrate of an organic light emitting structure without a patterning process, to connect an electrode (e.g., a cathode) and an element on the lower substrate, the electrode may be used as an etching mask to remove a portion of the charge transport layer. That is, the charge transport layer is formed after the electrode is formed. When the electrode is used as an etching mask, the electrode, the charge transport layer and/or the lower substrate may be damaged, which results in the degradation of luminescence characteristics of the organic light emitting display device. Therefore, there remains a need for an improved method of manufacturing an organic light emitting display structure, and a method of manufacturing an organic light emitting display device including the same.

Hereinafter, the invention will be described in detail with reference to the accompanying drawings.

FIGS. 1 through 5 are diagrams illustrating an exemplary embodiment of a method of manufacturing an organic light emitting structure in accordance with the invention.

Referring to FIG. 1, a pixel defining layer 120 may be formed on a lower substrate 100 on which a first electrode 110 is formed. The pixel defining layer 120 may be adjacent to and/or overlapping the first electrode 110. The lower substrate 100 may include a lower structure (not shown) such as a switching element, an insulation layer, an electrode, etc. disposed thereon.

The lower substrate 100 may include a transparent substrate such as a glass substrate, a quartz substrate, a transparent plastic substrate, etc. Alternatively, the lower substrate 100 may include a flexible substrate. The lower substrate 100 may include a pixel region in which an image is displayed, and a peripheral region in which an image may not be displayed. The pixel region may be arranged in a first direction and a second direction substantially perpendicular to the first direction, and the peripheral region may surround the pixel region. The lower substrate 100 may include a plurality of pixel regions and/or a plurality of peripheral regions respectively surrounding the pixel regions.

The first electrode 110 may be formed on the lower substrate 100. In exemplary embodiments, a conductive layer may be formed on the lower substrate 100, and then the conductive layer may be patterned to form the first electrode 110. The first electrode 110 may be formed on a region of the lower substrate 100 corresponding to the pixel region. In exemplary embodiments, a lead 130 may be additionally formed on another region of the lower substrate 100 corresponding to the peripheral region. The lead 130 may be exposed on the lower substrate 100.

The first electrode 110 may be a reflective electrode and/or a transparent electrode depending on an emitting type of the organic light emitting display device. When the organic light emitting display device is a bottom emission type organic light emitting display device, the conductive layer for the first electrode 100 may be formed using indium zinc oxide, indium tin oxide, gallium tin oxide, zinc oxide, gallium oxide, tin oxide, indium oxide, and a combination thereof. When the organic light emitting display device is a top emission type organic light emitting display device, the conductive layer for the first electrode 100 may be formed using aluminum (Al), silver (Ag), gold (Au), platinum (Pt), chrome (Cr), tungsten (W), molybdenum (Mo), titanium (Ti), palladium (Pd), alloys thereof and a combination thereof.

When the organic light emitting display device has an active matrix type, the switching element may be formed between the lower substrate 100 and the first electrode 110. The switching element may be physically and/or electrically connected to the first electrode 110.

The pixel defining layer 120 may be formed on the peripheral region of the lower substrate 100. The pixel defining layer 120 may be adjacent to the first electrode 110 and may substantially overlap the first electrode 110.

In exemplary embodiments, the pixel defining layer 120 may include a polymer containing a carbon-carbon chain. The pixel defining layer 120 may serve as an insulator. Thus, the pixel defining layer 120 may function as a black matrix when the organic light emitting display device is the bottom emission type.

Figure 2:
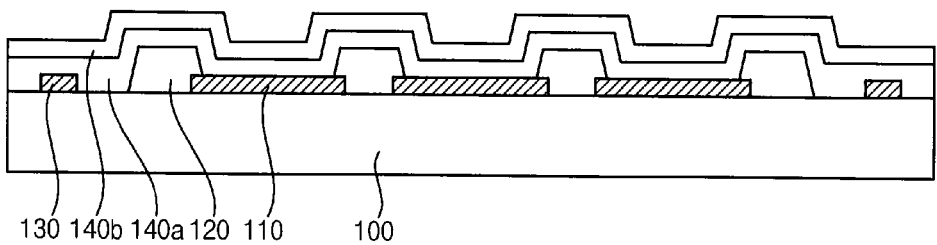

Referring to FIG. 2, a first preliminary organic layer 140a and a second preliminary organic layer 140b may be formed on the first electrode 110 and the pixel defining layer 120. The first preliminary organic layer 140a and the second preliminary organic layer 140b may include at least one of a hole injection layer and a hole transport layer.

In exemplary embodiments, the first preliminary organic layer 140a and the second preliminary organic layer 140b include the hole injection layer. The hole injection layer may facilitate hole injection from the first electrode 100 to the hole transport layer. In one exemplary embodiment, for example, the hole injection layer may include a hole injection material, for example, copper phthalocyanine ("CPC"), poly(3,4)-ethylenedioxythiophene ("PEDOT"), polyaniline ("PANI"), etc. The hole injection layer may be obtained (e.g., provided) by at least one of a vacuum deposition process, a thermal evaporation process, a slit coating process, a spin coating process and a printing process. In exemplary embodiments, the hole injection layer may be formed on the entirety of the first electrode 110 and the entirety of the pixel defining layer 120.

In exemplary embodiments, the first preliminary organic layer 140a and the second preliminary organic layer 140b include the hole transport layer. The hole transport layer may include a hole transport material, for example, 4,4'-bis[N-(1-naphthyl)-N-phenylamino]biphenyl ("NPB"), N,N'-diphenyl-N,N'-bis(3-methylphenyl)-1,1'-biphenyl-4,4'-diaminodiphenylamine tetramer ("TPD"), N,N'-di-1-naphthyl-N,N'-diphenyl-1,1'-biphenyl-4,4'-diamine ("NPD"), N-phenylcarbazole, polyvinylcarbazole, etc. In exemplary embodiments, the hole transport layer may be obtained by at least one of a slit coating process, a bar coating process, and a spin coating process.

Figure 3:
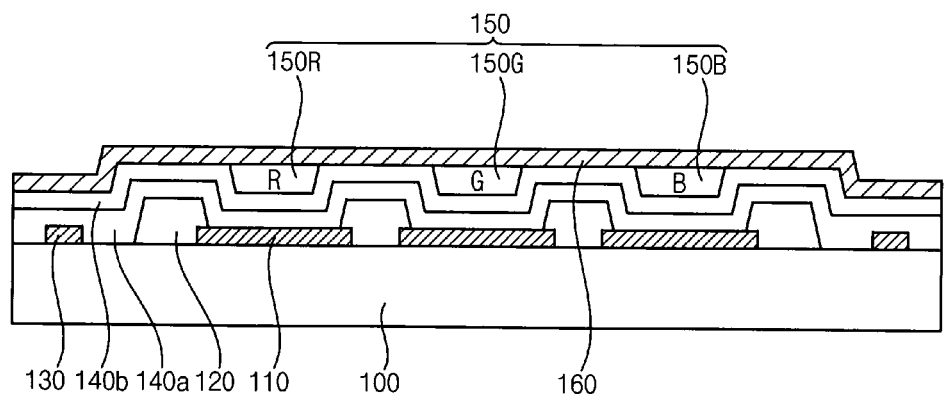

Referring to FIG. 3, an organic light emitting layer 150 may be formed on the first preliminary organic layer 140a and the second preliminary organic layer 140b. In exemplary embodiments, the organic light emitting layer 150 may be obtained by a solution patterning process. In one exemplary embodiment, for example, the solution patterning process may include at least one of an inkjet printing process, a nozzle printing process, a T-jet process and an electro spray process.

In exemplary embodiments, each of a plurality of pixel regions may correspond to a red colored pixel region, a green colored pixel region and a blue colored pixel region. Where pixel regions correspond to a red colored pixel region, a green colored pixel region and a blue colored pixel region, the organic light emitting layer 150 may include a red colored emitting layer 150R, a green colored emitting layer 150G and a blue colored emitting layer 150B. In one exemplary embodiment, for example, the organic light emitting layer 150 may be formed using at least one of light emitting materials for generating different colors of light, for example, a red color of light, a green color of light or a blue color of light. In other exemplary embodiments, the organic light emitting layer 150 may be formed using a mixture or a combination of the light emitting materials for generating a white color of light. In an exemplary embodiment, the light emitting materials may serve as dopant materials of the organic light emitting layer 150. Where the light emitting materials serve as dopant materials, the organic light emitting layer 150 may further include a host material having a relatively large band gap. Suitable dopant and host materials may be selected in accordance with a light-emitting mechanism of the organic light emitting layer 150, for example, a fluorescent mechanism or a phosphorescent mechanism.

Referring now to FIG. 3, a third preliminary organic layer 160 may be formed on the organic light emitting layer 150.

The third preliminary organic layer 160 may be deposited or coated over an entirety of the lower substrate 100. The third preliminary organic layer 160 may be obtained by a vacuum evaporation process, a thermal evaporation process, a slit coating process, a spin coating process, a printing process, etc.

The third preliminary organic layer 160 may include an electron transport layer. The electron transport layer may be formed using, e.g., tris(8-quinolinolato)aluminum (III) ("Alq3"), 2-(4-biphenylyl)-5-4-tert-butylphenyl-1,3,4-oxadiazole ("PBD"), bis(2-methyl-8-quinolinolato)-4-phenylphenolato-aluminum ("BAlq"), bathocuproine ("BCP"), etc. These may be used alone or in a combination thereof.

The third preliminary organic layer 160 may further include an electron injection layer on the electron transport layer. The electron injection layer may be formed using an alkaline metal, an alkaline earth metal, fluorides of these metals, oxides of these metals, etc. These may be used alone or in a combination thereof.

Figure 4:
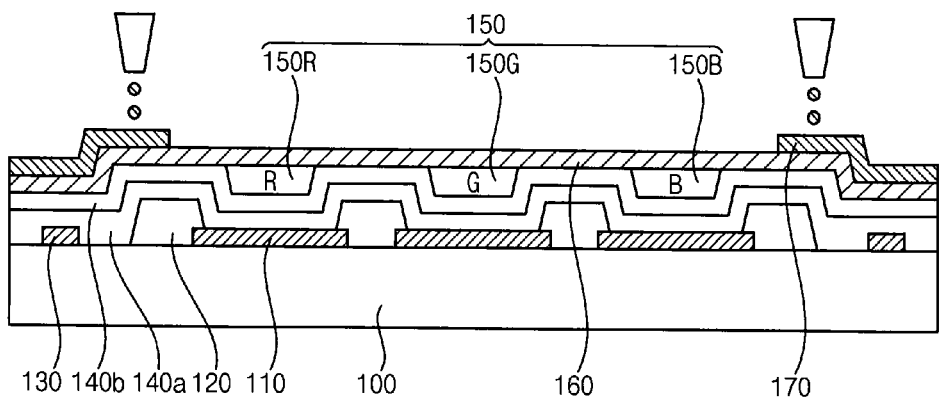

Referring to FIG. 4, an etching solution 170 may be applied on the first preliminary organic layer 140$a$, the second preliminary organic layer 140$b$ and/or the third preliminary organic layer 160. In exemplary embodiments, the etching solution 170 may be selectively applied on the first preliminary organic layer 140$a$, the second preliminary organic layer 140$b$ and the third preliminary organic layer 160 by at least one of an offset printing process, a gravure offset printing process, a gravure reverse offset printing process, a printing process, an inkjet printing process and a nozzle printing process.

The etching solution may include at least one of water, acetone and anisole. However, the etching solution may not be limited thereto. In exemplary embodiments, the first preliminary organic layer 140$a$, the second preliminary organic layer 140$b$ and the third preliminary organic layer 160 may be partially etched by the etching solution to change a portion of the first preliminary organic layer 140$a$, the second preliminary organic layer 140$b$ and the third preliminary organic layer 160 (i.e., the preliminary charge transport layer) to a charge transport layer.

In the partial etching of the first preliminary organic layer 140$a$, the second preliminary organic layer 140$b$ and the third preliminary organic layer 160, portions of each of the first preliminary organic layer 140$a$, the second preliminary organic layer 140$b$ and the third preliminary organic layer 160 may be removed. Accordingly, the lead 130 may be exposed on the lower substrate 100, by the removing the portions of the first preliminary organic layer 140$a$, the second preliminary organic layer 140$b$ and the third preliminary organic layer 160.

After the preliminary charge transport layer (e.g., the first preliminary organic layer 140$a$, the second preliminary organic layer 140$b$ and the third preliminary organic layer 160) is selectively etched by the etching solution, an inert gas may be sprayed on the lower substrate 100 to remove the etching solution remaining on the lower substrate 100.

Figure 5:
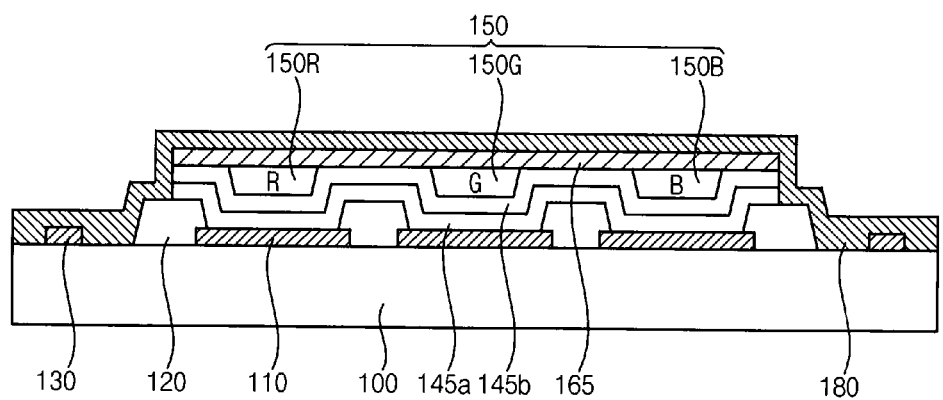

Referring to FIG. 5, the second electrode 180 may be formed to cover the entire organic light emitting layer 150 in a pixel region and the peripheral region of the lower substrate 100. In forming the second electrode 180, a layer of conductive material may be deposited on the lead 130, the pixel defining layer 120 and the charge transport layer. In exemplary embodiments, the second electrode 180 may be extended to be physically and/or electrically connected to the lead 130 exposed on the lower substrate 100. Accordingly, electrical contact efficiency between the second electrode 180 and the lead 130 is improved. That is, the organic light emitting display device may have improved luminescence characteristics.

In exemplary embodiments, by the removing the portions of the first preliminary organic layer 140$a$, the second preliminary organic layer 140$b$ and the third preliminary organic layer 160, the first through third charge transport layers 145$a$, 145$b$ and 165 may be formed before the second electrode 180 is formed, so that the lower substrate 100 may be encapsulated by forming the second electrode 180. Accordingly, encapsulating efficiency may be improved. That is, the organic light emitting display device may have an extended life time. The first through third charge transport layers 145$a$, 145$b$ and 165 may be collectively referred to as a charge transport layer.

The second electrode 180 may be a reflective electrode or a transparent electrode depending on the type of the first electrode 110. When the first electrode 110 is the transparent electrode, the second electrode 180 may be the reflective electrode. Where the second electrode 180 is the reflective electrode, the second electrode 180 may be formed using aluminum, silver, gold, platinum, chrome, tungsten, molybdenum, titanium, palladium or alloys thereof. Alternatively, when the first electrode 110 is the reflective electrode, the second electrode 180 may be the transparent electrode, and may be formed using indium zinc oxide, indium tin oxide, gallium tin oxide, zinc oxide, gallium oxide, tin oxide, indium oxide, and a combination thereof. Where the second electrode 180 is the transparent electrode, the second electrode 180 may be obtained by at least one of a sputtering process, a chemical vapor deposition ("CVD") process, an atomic layer deposition ("ALD") process, a vacuum deposition process, a printing process, etc. In exemplary embodiments, the second electrode 180 may have a monolayer structure, of a multi-layer structure including a transparent conductive layer and a metal layer.

In exemplary embodiments, a protection layer (not shown) and an upper substrate (not shown) may be formed on the second electrode 180. In exemplary embodiments, the protection layer may include a transparent insulating material. The upper substrate may include a transparent insulating substrate.

FIGS. 6 through 12 are diagrams illustrating an exemplary embodiment of a method of manufacturing an organic light emitting display device in accordance with the invention. In exemplary embodiments, the organic light emitting display device may include a lower structure, an organic light emitting structure and an upper structure.

Figure 6:
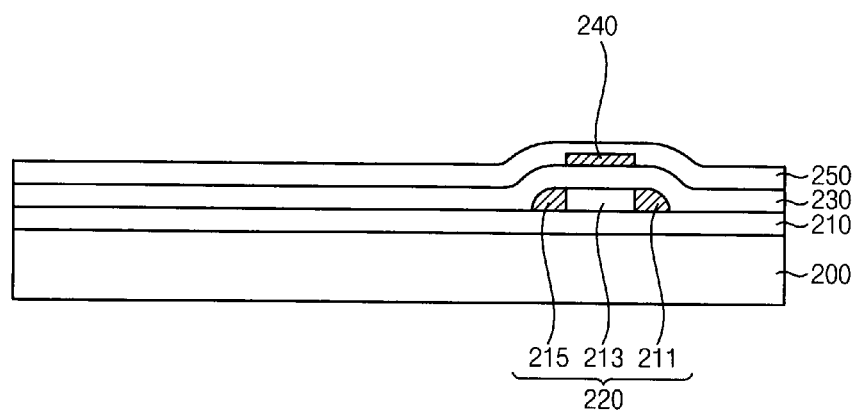
FIGS. 6 through 12 are diagrams illustrating an exemplary embodiment of a method of manufacturing an organic light emitting display device in accordance with the invention.
Figure 7:
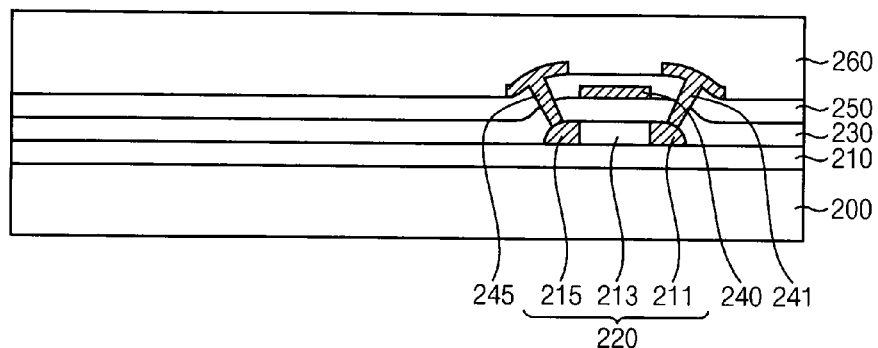

FIGS. 6 and 7 are cross-sectional view illustrating an exemplary embodiment of a method of manufacturing the lower structure of the organic light emitting display device. In one exemplary embodiment, for example, the lower structure may include a switching element, such as a thin film transistor ("TFT").

Referring to FIG. 6, a semiconductor pattern 220, a gate insulation layer 230 and a gate electrode 240 may be formed on a lower substrate 200.

In exemplary embodiments, the lower substrate 200 may include a transparent substrate such as a glass substrate, a quartz substrate, a transparent plastic substrate, etc. Examples of the transparent plastic substrate for the lower substrate 200 may include polyimide-based resin, acryl-based resin, polyethylene terephthalate-based resin, polycarbonate-based resin, polyacrylate-based resin, polyether-based resin, etc. The switching element may include a thin film transistor, an oxide semiconductor device, etc.

In exemplary embodiments, a buffer layer 210 may be formed on the lower substrate 200. The lower substrate 200 may include a transparent insulating substrate, for example, a glass substrate, a quartz substrate, a ceramic substrate, a transparent plastic substrate, etc. The buffer layer 210 may reduce or effectively prevent a diffusion of impurities, and may planarize an upper surface of the lower substrate 200. The buffer layer 210 may be formed using silicon oxide, silicon nitride, silicon oxynitride, etc. The buffer layer 210 may be obtained by a CVD process, a plasma enhanced chemical vapor deposition ("PECVD") process, a high density plasma-chemical vapor deposition ("HDP-CVD") process, a spin coating process, etc. Alternatively, the buffer layer 210 may be formed by performing a thermal oxidation process on the lower substrate 200. In alternative exemplary embodiments, the buffer layer 210 may not be formed on the lower substrate 200, and may be omitted from the lower structure of the organic light emitting device.

The switching element including the semiconductor pattern 220, the gate insulation layer 230 and the gate electrode 240 may be formed on the buffer layer 210. In exemplary embodiments, a preliminary semiconductor pattern may be formed on the buffer layer 210, and the gate insulation layer 230 covering the preliminary semiconductor pattern may be formed on the buffer layer 210. The preliminary semiconductor pattern may be formed using, e.g., polysilicon or amorphous silicon by a sputtering process, a CVD process, a low pressure chemical vapor deposition ("LPCVD") process, a vacuum evaporation process, etc. A crystallization process including, e.g., an annealing process or a laser treatment may be performed on the preliminary semiconductor pattern. In one exemplary embodiment, a heat treatment may be further performed on the preliminary semiconductor pattern to remove hydrogen therefrom.

The gate insulation layer 230 may be formed using, e.g., silicon oxide or a metal oxide. The gate insulation layer 230 may be obtained by a CVD process, a PECVD process, a sputtering process, a vacuum evaporation process, etc. The gate insulation layer 230 may have a single-layered (e.g., monolayer) structure or a multi-layered structure including silicon oxide and/or metal oxide.

The gate electrode 240 may be formed on the gate insulation layer 230. The gate electrode 240 may be formed using, e.g., a metal, a metal nitride, a conductive metal oxide, a transparent conductive material or a combination thereof. In one exemplary embodiment, for example, a first conductive layer (not illustrated) may be formed on the gate insulation layer 230 by a sputtering process, a CVD process, an ALD process, a pulse laser deposition ("PLD") process, a printing process, and then the first conductive layer may be patterned by, e.g., an etching process to obtain the gate electrode 240. A gate line (not illustrated) that may be extended on the gate insulation layer 230 and be physically and/or electrically connected to the gate electrode 240, may be formed together with the gate electrode 240. The gate line and the gate electrode 240 may be in and/or on a same layer of the organic light emitting device.

Impurities may be implanted into the preliminary semiconductor pattern using the gate electrode 240 as an ion-implantation mask. Accordingly, a source region 211 and a drain region 215 may be formed at opposing lateral portions of the preliminary semiconductor pattern to obtain the semiconductor pattern 220. A portion of the semiconductor pattern 220 between the source region 211 and the drain region 215 may be defined as a channel region 213. The channel region 213 may substantially overlap the gate electrode 240 formed on the gate insulation layer 230, in a plan view.

Referring again to FIG. 6, a first insulating interlayer 250 covering the gate electrode 240 may be formed on the gate insulation layer 230. The first insulating interlayer 250 may be formed using, e.g., silicon oxide, silicon nitride, silicon oxynitride or a transparent insulating material. The first insulating interlayer 250 may be obtained by a CVD process, a PECVD process, a HDP-CVD process, a spin coating process, etc.

Referring to FIG. 7, a source electrode 241 and a drain electrode 245 electrically connected to the source region 211 and the drain region 215, respectively, may be formed. A second insulating interlayer 260 covering the source electrode 241 and the drain electrode 245 may be formed on the first insulating interlayer 250.

In exemplary embodiments, the first insulating interlayer 250 and the gate insulation layer 230 may be partially removed to form openings or holes each of which may expose the source region 211 and the drain region 215. A second conductive layer sufficiently filling the openings or the holes may be formed on the first insulating interlayer 250, the source region 211 and the drain region 215. The second conductive layer may be patterned using a photoresist pattern or a mask pattern to form the source electrode 241 and the drain electrode 245 physically and/or electrically connected to the source region 211 and the drain region 215, respectively. The second conductive layer may be formed using chromium, aluminum, tantalum, molybdenum, titanium, tungsten, copper, silver, neodymium, etc., or an alloy of these metals. The second conductive layer may be obtained by a sputtering process, a CVD process, an ALD process, a vacuum evaporation process, a printing process, etc. In exemplary embodiments, the source electrode 241 may be electrically connected to a data line (not shown) of the organic light emitting display device and the drain electrode 245 may be electrically connected to a first electrode 110 (see FIG. 8).

The second insulating interlayer 260 may be formed using a transparent insulating material, e.g., acryl-based resin, polyimide-based resin, siloxane-based resin, PhotoBisbenzocyclobutene ("BCB"), etc. The second insulating interlayer 260 may be obtained by a spin coating process, a slit coating process, etc. In exemplary embodiments, the second insulating interlayer 260 may be formed using a material having a self-planarizing property. In one exemplary embodiment, a planarization process including a chemical mechanical polishing ("CMP") process and/or an etch-back process may be performed on the second insulating interlayer 260 so that the second insulating interlayer 260 may have a substantially level surface.

By performing the above-described processes, the lower structure including the lower substrate 200 and the switching element may be obtained. As described above, the switching element may include the TFT including a semiconductor pattern 220, the gate insulation layer 230, the gate electrode 240, the source electrode 241 and the drain electrode 245. The TFT may be P-type or N-type metal oxide semiconductor ("MOS") transistors according to the types of the impurities implanted into the preliminary semiconductor pattern. In exemplary embodiments, the switching element may include an oxide semiconductor device. In one exemplary embodiment, for example, a gate electrode and a gate insulation layer may be formed on the lower substrate 200, and an active layer may be formed on the gate insulation layer using a semiconductor oxide. Hereinafter, subsequent processes will be described in case that the switching element including the TFT is formed on the lower substrate 200 as illustrated in FIG. 7.

FIGS. 8 through 12 are cross-sectional views illustrating an exemplary embodiment of a method of manufacturing the organic light emitting structure on the lower structure obtained by the processes illustrated with reference to FIGS. 6 and 7.

In exemplary embodiments, the organic light emitting structure may be formed on the lower structure by processes substantially the same as or similar to those illustrated with reference to FIGS. 1 to 5. Thus, like reference numerals may refer to like elements and detailed descriptions thereof are omitted.

Figure 8:
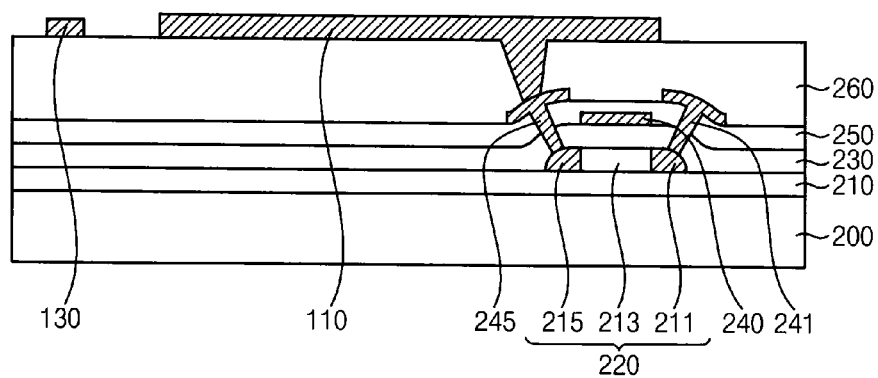

Referring to FIG. 8, a first electrode 110 physically and/or electrically connected with the drain electrode 245 may be formed on the second insulating interlayer 260. In exemplary embodiments, the second insulating interlayer 260 may be partially removed to form a contact hole exposing at least a portion of the drain electrode 245. A third conductive layer sufficiently filling the contact hole may be formed on the second insulating interlayer 260 and the drain electrode 245. The third conductive layer may be patterned to form the first electrode 110. The third conductive layer may be formed using a transparent conductive material including, e.g., indium tin oxide, zinc tin oxide, indium zinc oxide, zinc oxide, tin oxide, etc., or a metal including, e.g., chrome, aluminum, tantalum, molybdenum, titanium, tungsten, copper, silver, neodymium, etc., or an alloy of these materials. The third conductive layer may be obtained by a sputtering process, a CVD process, an ALD process, a vacuum evaporation process, a printing process, etc. The first electrode 110 may serve as an anode providing holes. In one exemplary embodiment, the first electrode 110 may have a multi-layered structure including a transparent conductive material layer and a metal layer.

In exemplary embodiments, a lead 130 spaced apart from the first electrode 110 may be formed on the lower substrate 100. The lead 130 and the first electrode 110 may be in and/or on a same layer of the organic light emitting device, and may include the same material.

Figure 9:
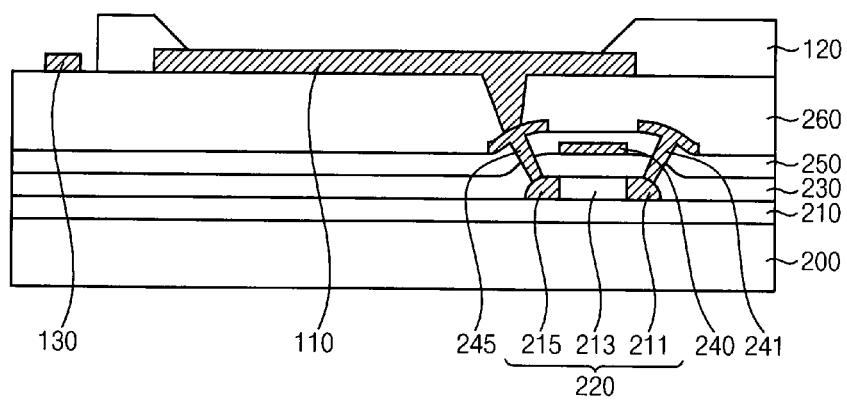

Referring to FIG. 9, a pixel defining layer 120 may be formed on the second insulating interlayer 260. The pixel defining layer 120 may substantially overlap the first electrode 110. The pixel defining layer 120 may expose the lead 130. In exemplary embodiments, the pixel defining layer 120 may include a polymer containing a carbon-carbon chain. The pixel defining layer 120 may serve as an insulator.

Figure 10:
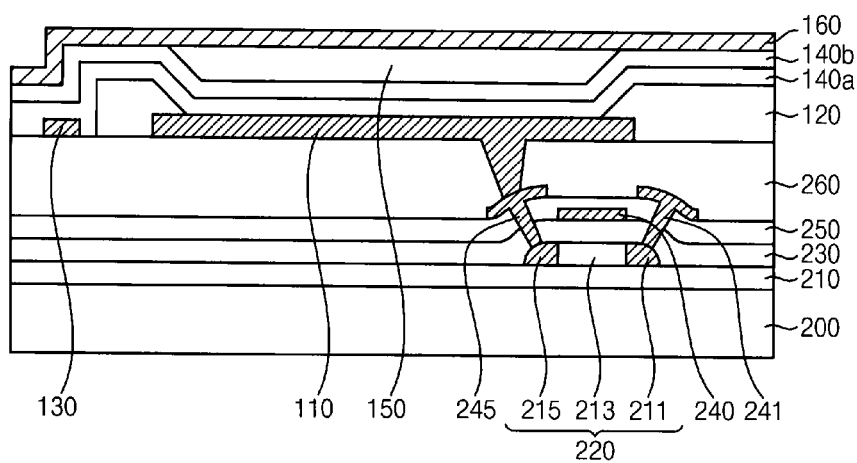

Referring to FIG. 10, a first preliminary organic layer 140a and a second preliminary organic layer 140b may be formed on the second insulating interlayer 260. The first preliminary organic layer 140a and the second preliminary organic layer 140b may be deposited or coated on a whole surface of the second insulating interlayer 260 by a spin coating process, a roll coating process, a vacuum evaporation process, a thermal evaporation process.

In exemplary embodiments, the first preliminary organic layer 140a and the second preliminary organic layer 140b may include a hole transport layer. The first preliminary organic layer 140a and the second preliminary organic layer 140b may further include a hole injection layer beneath the hole transport layer. Hereinafter, subsequent processes with respect to the first preliminary organic layer 140a and the second preliminary organic layer 140b including both the hole injection layer and the hole transport layer sequentially stacked on the second insulating interlayer 260 and the first electrode 110 are described.

The hole injection layer may be formed using the above-mentioned hole injection material.

The hole transport layer may be formed using the above-mentioned hole transport material.

An organic light emitting layer 150 may be formed on the first preliminary organic layer 140a and the second preliminary organic layer 140b. A third preliminary organic layer 160 may be formed on the organic light emitting layer 150.

Figure 11:
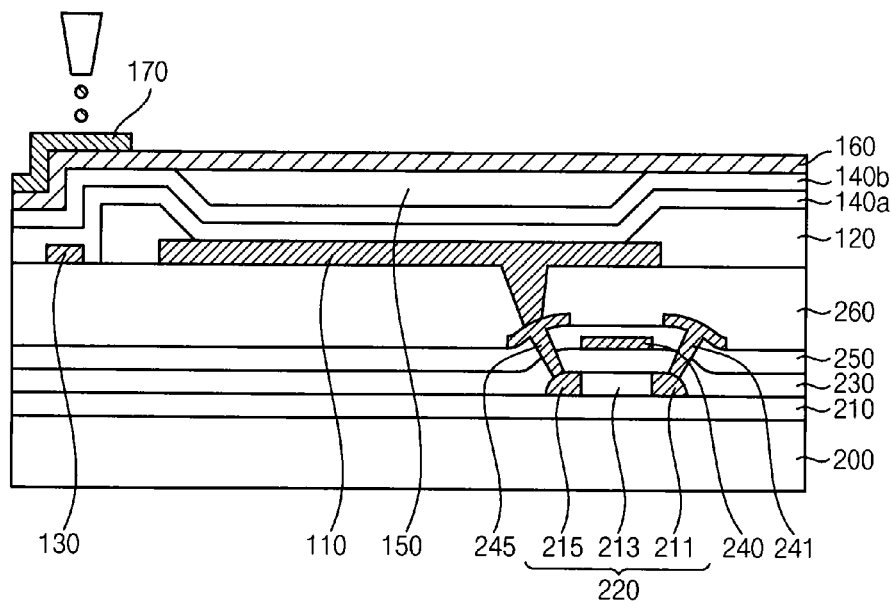

Referring to FIG. 11, an etching solution 170 may be applied on the first preliminary organic layer 140a, the second preliminary organic layer 140b and/or the third preliminary organic layer 160. The etching solution 170 may be selectively applied on the first preliminary organic layer 140a, the second preliminary organic layer 140b and the third preliminary organic layer 160 by at least one of an offset printing process, a gravure offset printing process, a gravure reverse offset printing process, a printing process, an inkjet printing process and a nozzle printing process.

The etching solution may include at least one of water, acetone and anisole. However, the etching solution may not be limited thereto. In exemplary embodiments, the first preliminary organic layer 140a, the second preliminary organic layer 140b and the third preliminary organic layer 160 may be partially etched by the etching solution to change a portion of the first preliminary organic layer 140a, the second preliminary organic layer 140b and the third preliminary organic layer 160 (i.e., the preliminary charge transport layer) to a charge transport layer. After the preliminary charge transport layer (e.g., the first preliminary organic layer 140a, the second preliminary organic layer 140b and the third preliminary organic layer 160) is selectively etched by the etching solution, an inert gas may be sprayed on the lower substrate 200 to remove the etching solution remaining on the lower substrate 200.

Figure 12:
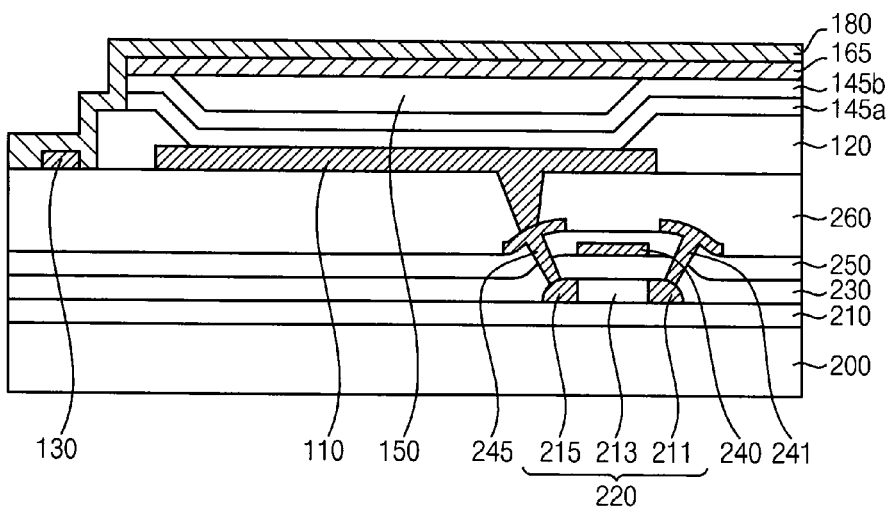

Referring to FIG. 12, the second electrode 180 may cover the entire organic light emitting layer 150 in a pixel region, and the peripheral region surrounding the pixel region. In forming the second electrode 180, a fourth conductive material may be deposited on the lead 130, the pixel defining layer 120 and the charge transport layer. The second electrode 180 may be extended to be physically and/or electrically connected to the lead 130 exposed on the lower substrate 200 in forming the second electrode 180. Accordingly, electrical contact efficiency between the second 180 and the lead 130 is improved. Thus, the organic light emitting display device may have improved luminescence characteristics.

In exemplary embodiments, by the removing the portions of the first preliminary organic layer 140a, the second preliminary organic layer 140b and the third preliminary organic layer 160, the first through third charge transport layers 145a, 145b and 165 may be formed before the second electrode 180, so that the lower substrate 100 may be encapsulated by forming the second electrode 180. Accordingly, encapsulating efficiency may be improved. That is, the organic light emitting display device may have an extended life time owing to the improved encapsulating efficiency. The first through third charge transport layers 145a, 145b and 165 may be collectively referred to as a charge transport layer.

By performing the above-described processes, the organic light emitting structure including the first electrode 110, the first charge transport layer 145a, the pixel defining layer 120, the organic light emitting layer 150, the second charge transport layer 145b and the second electrode 180 disposed on the lower structure may be obtained.

In exemplary embodiments, an upper structure (not shown) including, e.g., a protection layer and an upper substrate may be formed on the organic light emitting structure of FIG. 12 to obtain the organic light emitting device according to the invention. The protection layer may be formed using a transparent insulating material and the upper substrate may include a transparent insulating substrate.

According to one or more exemplary embodiment, an organic light emitting structure and an organic light emitting display device including the organic light emitting structure may be widely employed in various electronic and electric apparatuses such as televisions, mobile communication apparatuses, monitors, MP3 players or portable display apparatuses.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A method of manufacturing an organic light emitting structure, the method comprising:
   forming a first electrode on a lower substrate;
   forming a pixel defining layer adjacent to the first electrode on the lower substrate;
   forming a preliminary charge transport layer on the first electrode and the pixel defining layer;
   forming an organic light emitting layer on the preliminary charge transport layer;
   selectively etching the preliminary charge transport layer to form a charge transport layer and to expose a portion of the lower substrate, the exposed portion of the lower substrate spaced apart from the first electrode; and
   forming a second electrode on the organic light emitting layer, the second electrode extended to contact the exposed portion of the lower substrate spaced apart from the first electrode.

2. The method of claim 1, further comprising:
   forming a lead on the lower substrate and spaced apart from the first electrode,
   wherein the extended second electrode is electrically connected to the lead.

3. The method of claim 1,
   wherein the preliminary charge transport layer is formed by at least one of a slit coating process, a bar coating process and a spin coating process, and
   wherein the preliminary charge transport layer covers an entirety of the first electrode and an entirety of the pixel defining layer.

4. The method of claim 3, wherein the selectively etching the preliminary charge transport layer comprises partially etching the preliminary charge transport layer by an etching solution comprising at least one of water, acetone and anisole.

5. The method of claim 4, wherein the etching solution is selectively applied to the preliminary charge transport layer by at least one of an offset printing process, a gravure offset printing process, a gravure reverse offset printing process, a printing process, an inkjet printing process and a nozzle printing process.

6. The method of claim 5, further comprising applying an inert gas on the lower substrate to remove the etching solution remaining on the lower substrate, after the preliminary charge transport layer is partially etched by the etching solution.

7. The method of claim 2,
   wherein the lower substrate comprises a pixel region, and a peripheral region surrounding the pixel region, and
   wherein the first electrode is formed in the pixel region, and the lead is formed in the peripheral region.

8. The method of claim 1, wherein the charge transport layer comprises a hole transport layer or a hole injection layer.

9. The method of claim 1, wherein the charge transport layer comprises an electron transport layer or an electrode injection layer.

10. A method of manufacturing an organic light emitting display device, the method comprising:
    providing a lower structure comprising: a switching element and an insulating layer, on a lower substrate;
    forming a first electrode electrically connected to the switching element on the lower structure;
    forming a pixel defining layer adjacent to the first electrode on the lower structure;
    forming a preliminary charge transport layer on the first electrode and the pixel defining layer;
    forming an organic light emitting layer on the preliminary charge transport layer;
    selectively etching the preliminary charge transport layer to form a charge transport layer; and to expose a portion of the lower structure, the exposed portion of the lower structure spaced apart from the first electrode; and
    forming a second electrode on the organic light emitting layer, the second electrode extended to contact the exposed portion of the lower structure spaced apart from the first electrode.

11. The method of claim 10, further comprising:
    forming a lead on the lower substrate and spaced apart from the first electrode,
    wherein the extended second electrode is electrically connected to the lead.

12. The method of claim 10,
    wherein the preliminary charge transport layer is formed by at least one of a slit coating process, a bar coating process, and a spin coating process, and
    wherein the preliminary charge transport layer covers an entirety of the first electrode and an entirety of the pixel defining layer.

13. The method of claim 12, wherein the selectively etching the preliminary charge transport layer comprises partially etching the preliminary transport layer by an etching solution comprising at least one of water, acetone, and anisole.

14. The method of claim 13, wherein the charge transport layer partially covers the pixel defining layer.

15. The method of claim 13, wherein the etching solution is selectively applied to the preliminary charge transport layer by at least one of an offset printing process, a gravure offset printing process, a gravure reverse offset printing process, a printing process, an inkjet printing process and a nozzle printing process.

16. The method of claim 15, further comprising applying an inert gas on the lower substrate to remove the etching solution remaining on the lower substrate, after the preliminary charge transport layer is partially etched by the etching solution.

17. The method of claim 11,
    wherein the lower substrate comprises a pixel region, and a peripheral region surrounding the pixel region, and
    wherein the first electrode is formed in the pixel region, and the lead is formed in the peripheral region.

18. The method of claim 10, wherein the charge transport layer comprises a hole transport layer or a hole injection layer.

19. The method of claim 10, wherein the charge transport layer comprises an electron transport layer or an electrode injection layer.

20. The method of claim 10, wherein the switching element comprises a thin film transistor or an oxide semiconductor device.

* * * * *